United States Patent
Lee et al.

(10) Patent No.: US 7,696,832 B1
(45) Date of Patent: Apr. 13, 2010

(54) DIGITAL LOOP FILTER FOR ALL-DIGITAL PHASE-LOCKED LOOP DESIGN

(75) Inventors: Chen-yi Lee, Hsinchu (TW); Ching-che Chung, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 57 days.

(21) Appl. No.: 12/256,316

(22) Filed: Oct. 22, 2008

(30) Foreign Application Priority Data

Oct. 9, 2008  (TW) .............................. 97138825 A

(51) Int. Cl.
  H03L 7/06   (2006.01)
  H03L 7/08   (2006.01)
  H03L 7/085  (2006.01)

(52) U.S. Cl. .......................... 331/17; 331/1 A; 331/25

(58) Field of Classification Search ................. 331/1 A, 331/8, 16–18, 25; 327/156–159; 332/127; 360/51; 375/376; 455/260
See application file for complete search history.

(56) References Cited

U.S. PATENT DOCUMENTS

| | | | |
|---|---|---|---|
| 5,473,285 A | 12/1995 | Nuckolls et al. | |
| 7,042,972 B2 | 5/2006 | Fahim | |
| 7,145,399 B2 | 12/2006 | Staszewski et al. | |
| 2003/0088834 A1* | 5/2003 | Murakami et al. | 716/1 |

OTHER PUBLICATIONS

IEEE Transactions On Circuits And Systems—II: Express Briefs, vol. 52, No. 3, Mar. 2005, "Phase-Domain All-Digital Phase-Locked Loop", By Robert Bogdan Staszewski and Poras T. Blsara, p. 159-163.

* cited by examiner

*Primary Examiner*—David Mis
(74) *Attorney, Agent, or Firm*—Chun-Ming Shih

(57) ABSTRACT

A digital loop filter installed in an all-digital phase-locked loop (PLL) receives a digitally controlled oscillator (DCO) control code transmitted from a PLL controller in the all-digital PLL, and calculate an average value, such that the PLL controller can produce another DCO control code by the average value for controlling and adjusting an output signal of a digitally controlled oscillator (DCO) in the neighborhood of the average value to maintain compensating a phase/frequency difference with an input signal, so as to minimize the jitter effect of the input signal on the all-digital PLL, reduce the jitter effect of the output signal, and keep tracking and locking the frequency and the phase of the input signal.

10 Claims, 2 Drawing Sheets

DIGITAL LOOP FILTER FOR ALL-DIGITAL PHASE-LOCKED LOOP DESIGN

BACKGROUND OF THE INVENTION

1. Field of Invention

The present invention relates to a digital loop filter installed in an all-digital phase-locked loop (PLL) for reducing the jitter effect of an input signal to the all-digital PLL as well as reducing the jitter effect of the output signal, such that the all-digital PLL can keep tracking and locking the frequency and phase of the input signal.

2. Description of Related Art

As the consumption and importance of communication products increase and integrated circuits develop rapidly, the demand for communication integrated circuits increases correspondingly, wherein a phase-locked loop (PLL) is one of the common circuits applied for the modulation and demodulation in the communication field and used as a frequency synthesizer on a radio system or a clock signal recovery system with digital circuits.

The principle of the PLL is to track and lock the phase and the frequency of the input signal and the output signal, such that the two signals can be maintained consistently all the time. If the phase error of two signals is equal to zero or very small, then we generally call it is locked. Note that fast lock-in time becomes increasingly important and a necessary feature for the PLL design.

The conventional design of a digital loop filter generally uses an accumulator to average and eliminate the jitter effect of the input signal to the PLL as disclosed in issued patents such as U.S. Pat. No. 7,042,972 issued to Qualcomm, U.S. Pat. No. 7,145,399 issued to Texas Instruments, and a journal entitled "Phase Domain All-Digital Phase-Locked Loop" published in the IEEE Transactions on circuits and systems II on March 2005.

However, the foregoing issued patents and journal adopt the accumulation method to eliminate the jitter effect of an input signal to the PLL, but the accumulator will also record jitter information even when the jitter of the input signal is very large. As a result, the output of the accumulator will become unstable, and the period jitter of the output signal of the PLL cannot be reduced, and thus causing problems to the design of digital loop filters.

In addition, U.S. Pat. No. 5,473,285 entitled "Method and apparatus for performing phase acquisition in an all digital phase lock loop" and issued to Motorola discloses a method of updating an anchor register, and capable of generating a baseline frequency required by the PLL controller. Four consecutive control signals (UP/DOWN) are used for updating the baseline frequency, so as to reduce some of the jitter effect of the input signal on the PLL. However, if the jitter of the input signal is very large, the method of updating an anchor register cannot suppress the jitter effect of the input signal on the PLL effectively, and thus the method cannot reduce the jitter effect of the output signal to the PLL, and the issue of period jitters still exists.

SUMMARY OF THE INVENTION

In view of the foregoing shortcomings of the prior art that cannot reduce the period jitter of the output signal of the PLL effectively, the inventor of the present invention developed a digital loop filter for lowering the output jitter of the all-digital PLL design.

Therefore, it is a primary objective of the present invention to provide a digital loop filter for an all-digital PLL design, and the digital loop filter is installed in an all-digital PLL for reducing the jitter effect of an input signal to the all-digital PLL as well as the jitter effect of an output signal effectively, such that the all-digital PLL can maintain tracking and locking the input signal frequency and the phase.

Another objective of the present invention is to provide a digital loop filter for an all-digital PLL design, and the digital loop filter adopts an all-digital PLL related design technology to improve the electric leakage issue of a traditional analog PLL and provides a feasible solution to the difficulty of being operated at a low voltage, so as to enhance the cost structure and product competitiveness substantially.

BRIEF DESCRIPTION OF THE DRAWINGS

The invention, as well as its many advantages, may be further understood by the following detailed description and drawings in which.

DETAILED DESCRIPTION OF THE INVENTION

Figure 1:
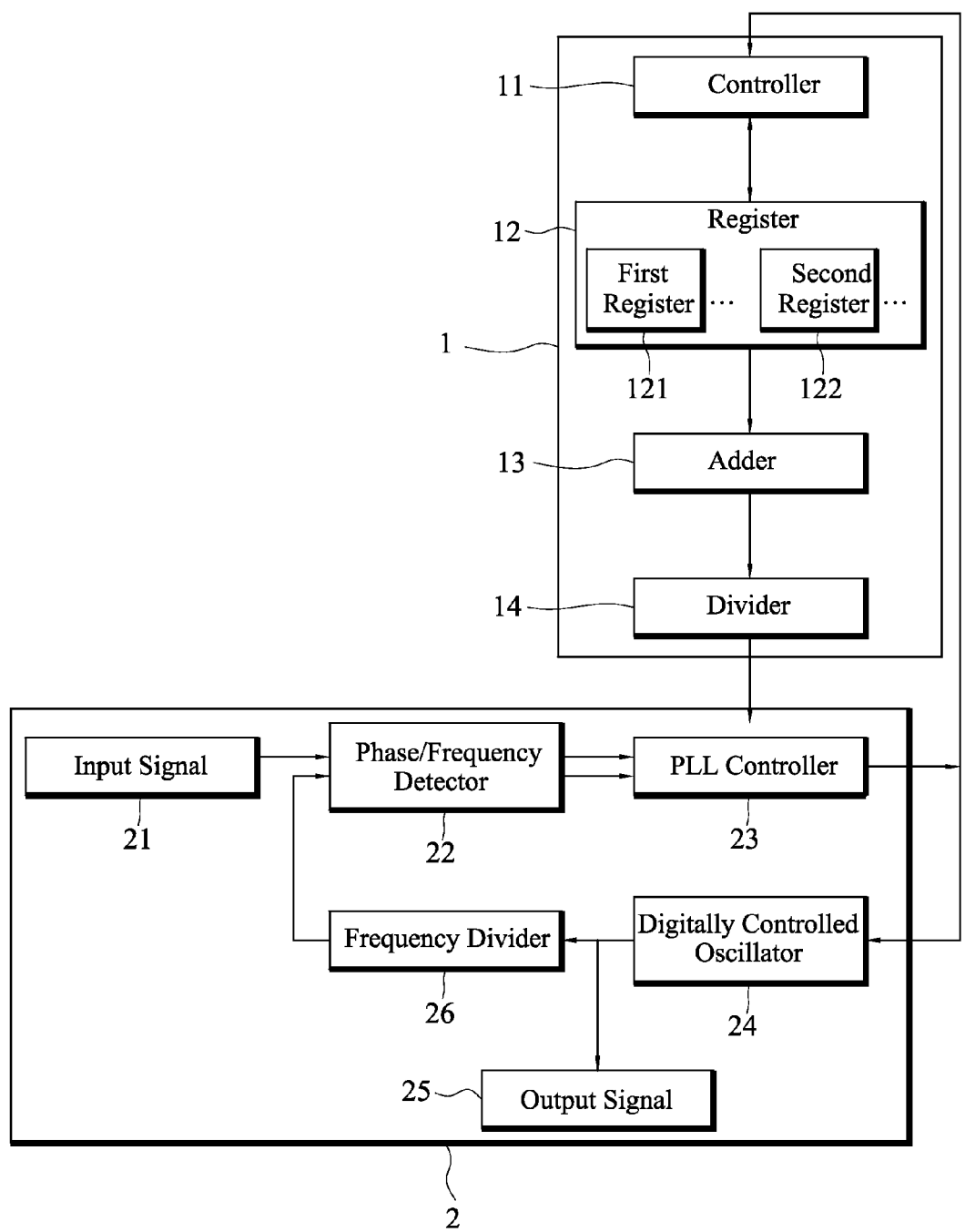
FIG. 1 is a schematic view of a structure of a digital loop filter installed in an all-digital PLL in accordance with a preferred embodiment of the present invention.

The present invention relates to a digital loop filter for an all-digital PLL design. With reference to FIG. 1 for a schematic view of a structure of a digital loop filter 1 installed in an all-digital PLL 2, the digital loop filter 1 includes a controller 11 for receiving a DCO control code and another DCO control code transmitted from a phase-locked loop (PLL) controller in the all-digital PLL 2, and updating the DCO control code and the other DCO control code into a plurality of registers 12.

The plurality of registers 12 are provided for storing the DCO control code and the other DCO control code updated and transmitted by the controller 11, wherein the plurality of registers 12 include a plurality of first registers 121 (such as $M=T_0 \sim T_{(M-1)}$) and a plurality of second registers 122 (such as $K=T_M \sim T_{(M+K-1)}$), and the plurality of first registers 121 are provided for storing the DCO control code transmitted from the controller 11, and the plurality of second registers 122 are provided for storing another DCO control code generated by the PLL controller 23 and transmitted from the controller 11.

An adder 13 is provided for receiving and calculating the total of the DCO control codes in the plurality of first registers 121.

A divider 14 is provided for receiving and calculating an average value of the totals of the DCO control codes calculated by the adder 13, and transmitting the average value to the PLL controller 23.

The all-digital PLL 2 includes a phase/frequency detector 22 (PFD) for measuring phase and frequency error between the input signal 21 and the output signal 25 which generated after a frequency division by a frequency divider 26. If there is a phase/frequency difference between these two signals, the phase/frequency detector 22 will send out control signal (UP/DOWN) to the PLL controller 23.

The PLL controller 23 is provided for receiving the other signal and the average value transmitted from the phase/frequency detector 22 and the digital loop filter 1 to generate the DCO control code and the other DCO control code respectively.

A digital controlled oscillator (DCO) 24 is provided for receiving the other DCO control code transmitted from the PLL controller 23 to compensate a phase difference and a frequency difference with the input signal 21, and the frequency divider 26 receives a signal transmitted from the DCO 24 and performs a frequency division to lower the frequency of the signal, and then transits the signal to the phase/frequency detector 22.

In a preferred embodiment of the present invention, the first registers 121 calculates the quantity of DCO control codes of the average values, and the quantity of first registers 121 will affect the stability of the output of the average value. If the quantity of first registers 121 increases, the stability of the output by the digital loop filter 1 will be improved.

In the preferred embodiment of the present invention, the second registers 122 come with a quantity equal to the other DCO control codes inputted each time, and the quantity of second registers 122 is at least two. If the quantity of second registers 122 is equal to two, the content of the plurality of registers 12 is updated and simplified by removing the maximum and the minimum, and storing the remaining DCO control codes in the first register 121, so as to increase the processing speed of the digital loop filter 1 and lower the hardware cost.

In a preferred embodiment of the present invention, if the quantity of second registers 122 is greater than two, the contents of the plurality of registers 12 are updated and changed by sorting the DCO control codes and the other DCO control codes (in a descending order or an ascending order), and maintaining the DCO control code situated at the median (wherein the quantity of DCO control codes is equal to the quantity of first registers 121), and then storing the DCO control codes in the first registers 121.

If the digital loop filter 1 in accordance to this embodiment of the invention is used in the all-digital PLL 2 with a low jitter, and a phase/frequency difference occurs between the signals after the input signal 21 generated by the DCO 24 has gone through a frequency division processed by the frequency divider 26, the phase/frequency detector 22 will detect a too-fast or a too-slow output of the DCO 24, and send the other signal (UP/DOWN) to the PLL controller 23, such that the PLL controller 23 can generate the DCO control code according to a result detected by the phase/frequency detector 22, and send out the DCO control code to be processed by related electronic components on the digital loop filter 1, so as to produce the average value. The average value is sent to the PLL controller 23, so that the PLL controller 23 can generate the other DCO control code according to the average value to control and adjust an output signal 25 of the DCO 24 to be maintained in the neighborhood of the average value, so as to keep compensating the phase/frequency difference with the input signal 21 and further reduce the jitter effect of the input signal 21 to the all-digital PLL 2 and reduce the jitter effect of the output signal 25 effectively. As a result, the all-digital PLL 2 can maintain tracking and locking the frequency and the phase of the input signal 21.

Figure 2:
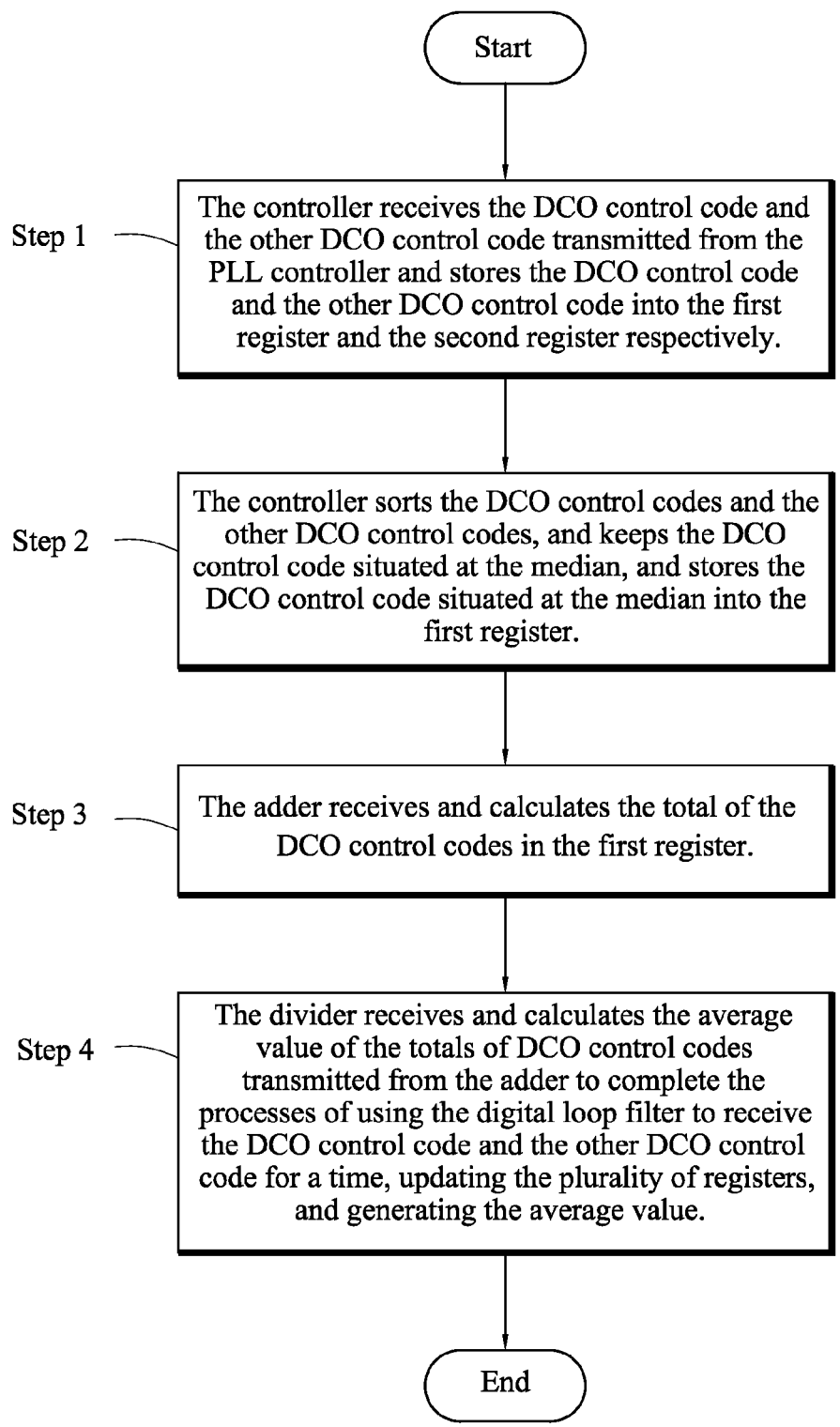
FIG. 2 is a flow chart of generating an average value in accordance with a preferred embodiment of the present invention.

With reference to FIG. 2 for a flow chart of receiving a DCO control code and another DCO control code to generate an average value in accordance when a digital loop filter 1 is used at an all-digital PLL 2 of the low jitter in accordance with a preferred embodiment of the present invention, the procedure comprises the following steps:

Step 1: The controller 11 receives the DCO control code and the other DCO control code transmitted from the PLL controller 23, and stores the DCO control code and the other DCO control code into the first register 121 and the second register 122 respectively.

Step 2: The controller 11 sorts the DCO control codes and the other DCO control codes, and keeps the DCO control code situated at the median, and stores the DCO control code situated at the median into the first register 121.

Step 3: The adder 13 receives and calculates the total of the DCO control codes in the first register 121.

Step 4: The divider 14 receives and calculates the average value of the totals of DCO control codes transmitted from the adder 13 to complete the processes of using the digital loop filter 1 to receive the DCO control code and the other DCO control code for a time, updating the plurality of registers 12, and generating the average value.

If the digital loop filter 1 is used in the all-digital PLL 2 in accordance with a preferred embodiment of the present invention, the method of receiving the DCO control code and the other DCO control code to generate the average value provides the following experiment data:

Assumed that the quantity of first register 121 (such as $M=T_0 \sim T_{(M-1)}$) in the digital loop filter 1 is equal to four ($T_0 \sim T_3$), and the initial value of the DCO control code in the first register 121 is set to be (9,10,10,10), and the quantity of second registers 122 (such as $K=T_M \sim T_{(M+K-1)}$) in the digital loop filter 1 is equal to two ($T_4 \sim T_5$), and the other DCO control codes stored in the second register 122 are equal to (10,11)=>(12,13)=>(14,13)=>(12,11)=>(12,13)=>(12,11) =>(12,13)=>(12,11)=>(12,13)=>(12,11) ... in sequence.

By substituting the experiment data into the procedure as shown in FIG. 2, the average value can be calculated. In other words, if the initial value of the DCO control code is set to (9,10,10,10), and the other DCO control code is set to (10,11), the controller 11 will remove the maximum (which is 11) and the minimum (which is 9) in the two DCO control codes, and stores the remaining DCO control codes into the first registers 121 ($T_0 \sim T_3$), such that the DCO control codes in the first registers 121 ($T_0 \sim T_3$) will be changed from (9,10,10,10) to (10,10,10,10), and the average value will be changed from (9.75) to (10).

With the change of the other DCO control code, the DCO control codes in the first registers 121 ($T_0 \sim T_3$) will be changed to =>(12,10,10,10) =>(12,13,10,10) =>(12,12,11,10) =>(12,12,11,12) =>(12,12,11,12) =>(12,12,12,12) =>(12,12,12,12) =>(12,12,12,12) =>(12,12,12,12) ... in sequence, such that the average value is changed from (10) into =>(10.5) =>(11.25) =>(11.25) =>(11.75) =>(11.75) =>(12) =>(12) =>(12)=>(12) ... in sequence.

In summary of the description above, the difference of the technical characteristic between the present invention and the prior art resides on that after the all-digital PLL 2 is locked, the PLL controller 23 will adjust the other DCO control code continuously to track a frequency and phase change of the input signal 21, but the digital loop filter 1 of the invention keeps removing the recorded maximum and minimum of the DCO control codes and the other DCO control codes continuously, and thus the digital loop filter 1 of the invention can output the average value stably within a very short time and maintain a stable output of the all-digital PLL 2, so as to eliminate the jitter effect of the input signal 21 to the all-digital PLL 2 and maintain the ability of tracking the frequency and the phase of the input signal 21.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A digital loop filter, installed in an all-digital phase-locked loop (PLL), for controlling an output signal of a digitally controlled oscillator (DCO) in said all-digital PLL, and said digital loop filter comprising:
- a controller, for receiving a DCO control code and another DCO control code transmitted from a PLL controller in said all-digital PLL;
- a plurality of registers, for storing said DCO control code and said another DCO control code updated and transmitted by said controller;
- an adder, for receiving and calculating a total of said DCO control codes in said registers; and
- a divider, for receiving and calculating an average value of said totals of said DCO control codes calculated by said adder, and then transmitting said average value to said PLL controller, and driving said PLL controller to generate said another DCO control code, so as to control and adjust an output signal of said DCO in a neighborhood of said average value, and keep compensating a phase difference and a frequency difference with an input signal in said all-digital PLL.

2. The digital loop filter as recited in claim 1, wherein said plurality of registers comprises a plurality of first registers for storing said DCO control code transmitted from said controller.

3. The digital loop filter as recited in claim 2, wherein said adder receives and calculates said total of said DCO control codes through said plurality of first registers.

4. The digital loop filter as recited in claim 2, wherein said first registers calculate a quantity of DCO control codes of said average value, and a quantity of said first registers affects the stability of an output of said average value.

5. The digital loop filter as recited in claim 1, wherein the plurality of registers comprises a plurality of second registers for storing said another DCO control code generated by said PLL controller and transmitted from said controller.

6. The digital loop filter as recited in claim 5, wherein the second registers store a quantity of other DCO control codes entered each time, and said quantity of second registers is at least two.

7. The digital loop filter as recited in claim 6, wherein if said quantity of second registers is equal to two, the content of said plurality of registers will be updated and simplified by removing the maximum and the minimum, and then storing remaining DCO control codes in said first register.

8. The digital loop filter as recited in claim 6, wherein if said quantity of second registers is equal to two, the content of said plurality of registers will be updated to sort said DCO control code and said another DCO control code, and keep said DCO control codes situated at the median, and store said DCO control code situated at the median into said first register.

9. The digital loop filter as recited in claim 8, wherein said sorting is performed in a descending order or an ascending order.

10. The digital loop filter as recited in claim 1, wherein the all-digital PLL comprises:
- a phase/frequency detector, for measuring the input signal and generating a signal after performing a frequency division by a frequency divider, and if there is a phase/frequency difference between said two signals, said phase/frequency detector will send out another signal to said PLL controller;
- said PLL controller, for receiving said other signal and said average value received from said phase/frequency detector and said digital loop filter to generate said DCO control code and said other DCO control code respectively;
- said DCO, for receiving said other DCO control code transmitted from said PLL controller to compensate a phase difference and a frequency difference with said input signal;
- said frequency divider, for receiving a signal transmitted from said DCO, and performing a frequency division to lower the frequency of said signal, and then transmitting said signal to said phase/frequency detector.

* * * * *